United States Patent [19]
Riederer et al.

[11] Patent Number: 5,363,844
[45] Date of Patent: Nov. 15, 1994

[54] BREATH-HOLD MONITOR FOR MR IMAGING

[75] Inventors: Stephen J. Riederer; Yu L. Liu; Richard L. Ehman, all of Rochester, Minn.

[73] Assignee: Mayo Foundation for Medical Education and Research, Rochester, Minn.

[21] Appl. No.: 106,178

[22] Filed: Aug. 13, 1993

[51] Int. Cl.⁵ ............................................. A61B 5/055
[52] U.S. Cl. .................... 128/653.2; 128/721
[58] Field of Search ................. 128/653.2, 653.5, 716, 128/721

[56] References Cited

U.S. PATENT DOCUMENTS

| | | | |
|---|---|---|---|
| 4,564,017 | 1/1986 | Glover | 128/653.2 |
| 4,878,499 | 11/1989 | Suzuki et al. | 128/653.2 |
| 4,905,699 | 3/1990 | Sano et al. | 128/653.2 |
| 5,251,629 | 10/1993 | Koizumi et al. | 128/653.2 |

*Primary Examiner*—Ruth S. Smith
*Attorney, Agent, or Firm*—Quarles & Brady

[57] ABSTRACT

In an NMR system a respiration monitor provides a visual feedback to the patient which enables the patient to perform a series of breath-holds with the patient's diaphragm positioned at the same reference point. This enables NMR data to be acquired over a series of breath-holds without introducing blurring or image artifacts. Between breath-holds a navigator pulse sequence is used to gather NMR data from which diaphragm position is measured, and during each breath-hold the pulse sequence is changed to gather NMR image data.

9 Claims, 3 Drawing Sheets

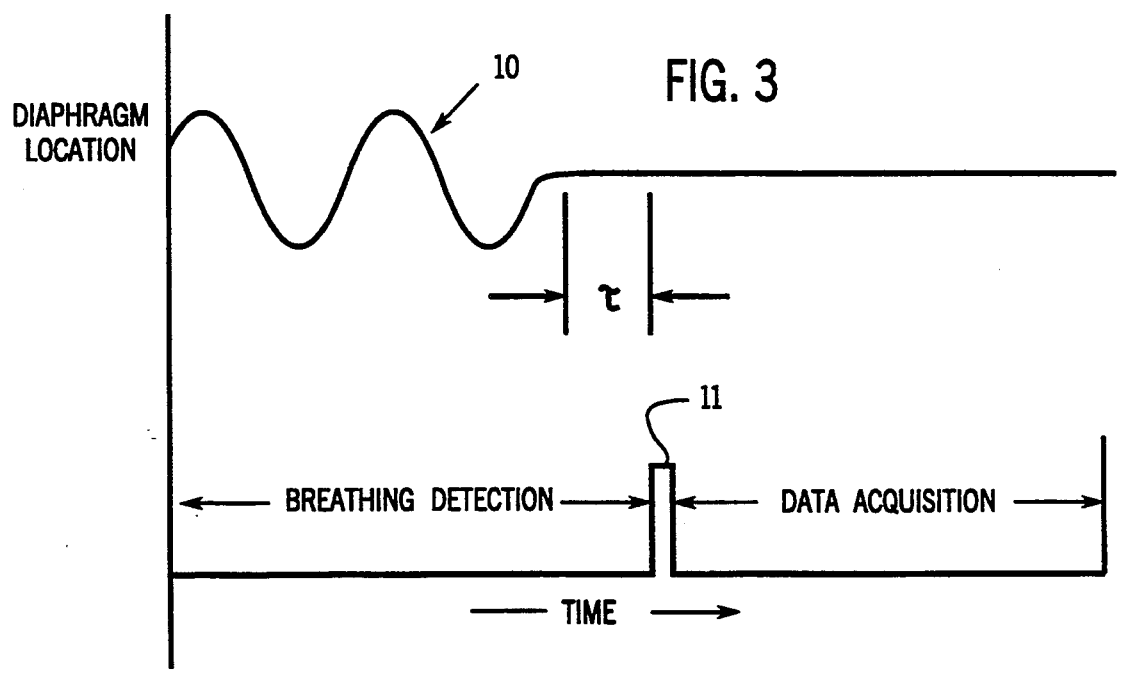
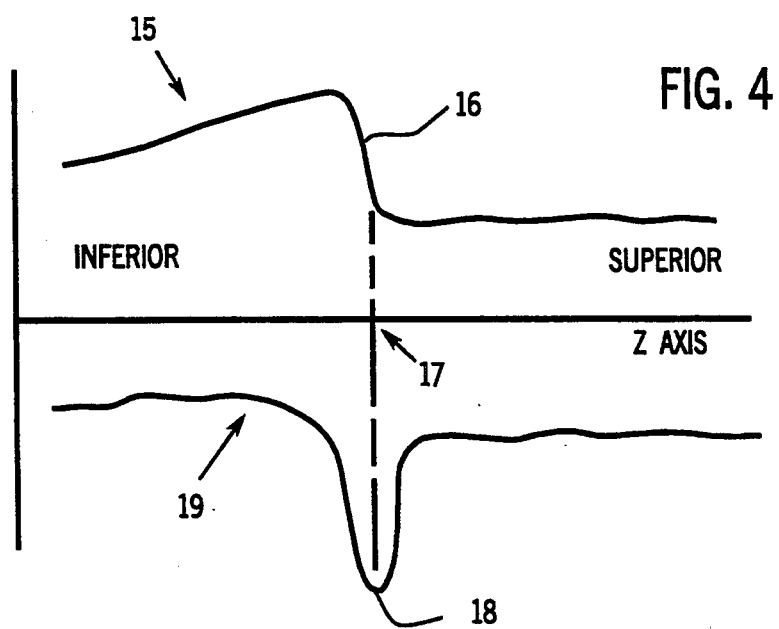

BREATH-HOLD MONITOR FOR MR IMAGING

BACKGROUND OF THE INVENTION

The field of the invention is nuclear magnetic resonance imaging (MRI) methods and systems. More particularly, the invention relates to the reduction of image artifacts caused by respiratory motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Abdominal and cardiothoracic imaging are important applications of MRI, but image degradation due to respiratory motion remains a major problem because a significant time span is required to acquire the image data. One general strategy for reducing such degradation is to use artifact reduction methods, such as respiratory ordered phase encoding, gradient moment nulling, or view averaging. These all work to some degree. However, a fundamental limitation of all of these methods is that none accounts for the blurring which accompanies the view-to-view motion effects. In the abdomen this motion is principally in the superior-inferior (S/I) direction with a range exceeding 10 mm. This is clearly a problem in imaging sagittal and coronal sections. Additionally, during imaging of transverse sections this motion will cause many structures to move completely in and out of the section during the acquisition.

An alternative strategy is to circumvent respiratory motion effects by using breath-hold image acquisition. This approach has been used in many applications, including angiographic imaging, $T_1$-weighted and $T_2$-weighted imaging of the abdomen, cine phase contrast imaging, pulmonary imaging, cardiac imaging and imaging of the coronary arteries. Again, these all work to some degree. However, for many of these methods the resolution or signal-to-noise ratio (SNR) could be improved if the acquisition were extended over, or broken into, several periods of suspended respiration. The problem with this is that the degree of chest inflation cannot be accurately reproduced, causing misregistration of the thoracic and abdominal structures from one breath-hold to the next. This results in image artifacts and blurring. Indeed, we have found that the level of patient reproducibility in S/I diaphragmatic position is 8.3 mm, roughly comparable to the thickness of a typical axial section.

SUMMARY OF THE INVENTION

The present invention is a breath-hold monitor which visually feeds back to the patient diaphragmatic position such that the patient can suspend respiration consistently and MRI data can be accurately acquired over a series of breath-hold acquisitions. More specifically, the invention includes a respiratory monitor which measures the patient's diaphragm position, a display which indicates diaphragm position to the patient during the scan, and means for triggering MRI data acquisition when a reference diaphragm position is maintained for a preset time interval.

Yet another aspect of the invention is the use of the MRI system itself as the respiratory monitor. An MRI "navigator" pulse sequence which excites a column of spins located along the S/I direction and transecting the patient's diaphragm is executed repeatedly while the patient is breathing and the resulting MR signal is acquired and processed to detect the location of the diaphragm. No devices need be attached to the patient and the diaphragm position can be determined and displayed in approximately 10 msec. When proper diaphragm position is achieved, the NMR system changes from the navigator pulse sequence to the image acquisition pulse sequence.

A general object of the invention is to improve the registration of MRI data acquired during a series of breath-holds. By using the visual feedback of diaphragm position, patients are able to reproduce diaphragm location from one breath-hold to the next within a 2 mm range. This is equivalent to a tolerance of $\pm 1$ pixel for a typical image with a 256 point, 260 mm field of view.

A more specific object of the invention is to improve the SNR of images acquired during a single breath-hold. By accurately registering the diaphragm a series of NMR images can be acquired in a corresponding series of breath-holds and the data may be averaged to improve SNR.

Yet another more specific object of the invention is to improve the resolution of single breath-hold images. Because diaphragm registration is accurate, additional views can be acquired during separate breath-holds, thus enabling more phase encoding views to be acquired and images with higher resolution along the phase encoding axis to be reconstructed.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 3 is a graphic representation of the process performed by the MRI system of FIG. 1 to practice the present invention; and FIG. 4 is a graph of the navigator NMR signal produced by the MRI system of FIG. 1 as it is processed.

DESCRIPTION OF THE PREFERRED EMBODIMENT

Figure 1:
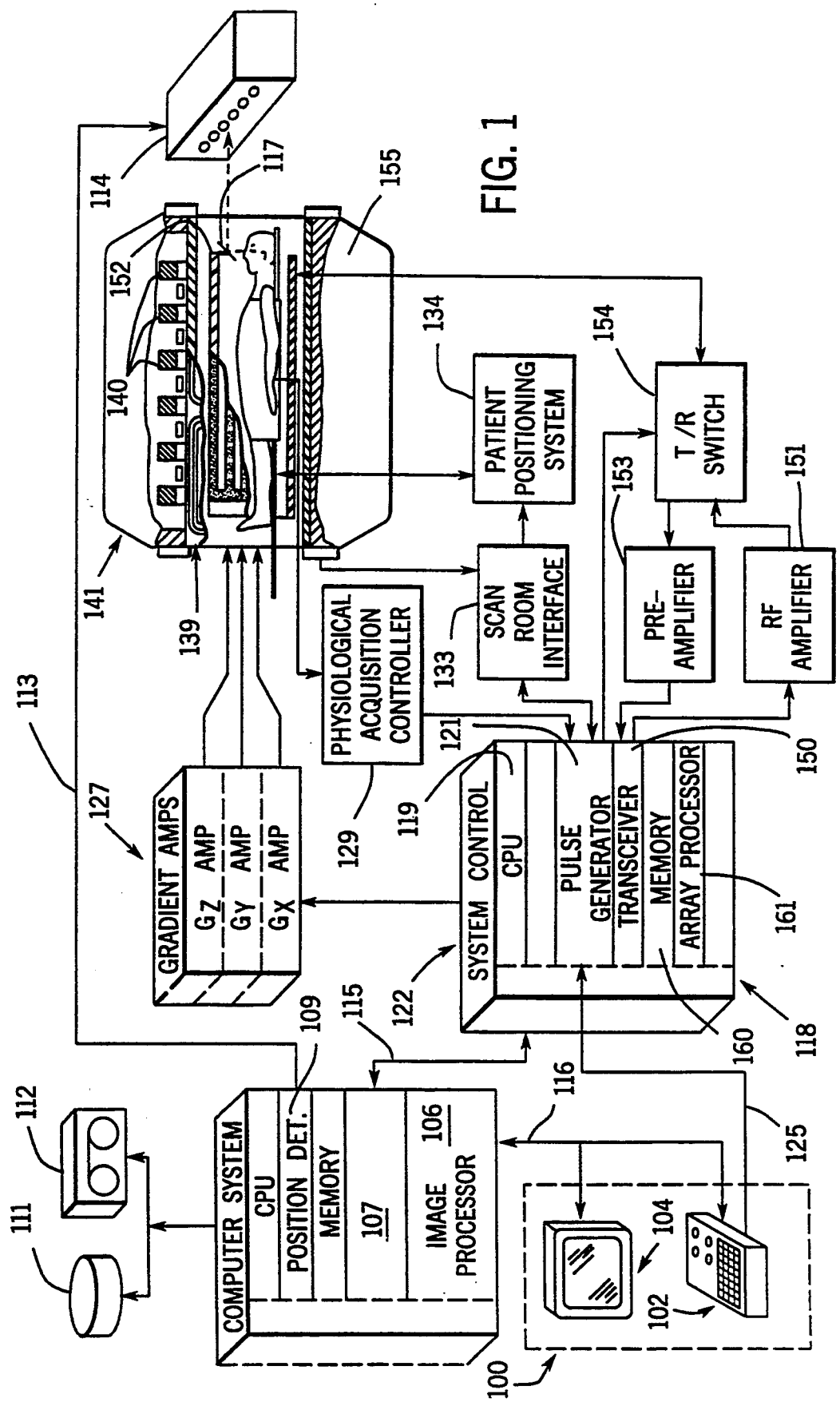
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108, a position detector module 109 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_x$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. As will be described in more detail below, NMR data may also be conveyed to the position detector module 109 which determines therefrom the location of the patient's diaphragm and outputs a signal through link 113 to an LED display 114. The detector module 109 also sends a respiratory trigger signal to the pulse generator module 121 to signal that an image NMR pulse sequence is to be executed.

Figure 2:
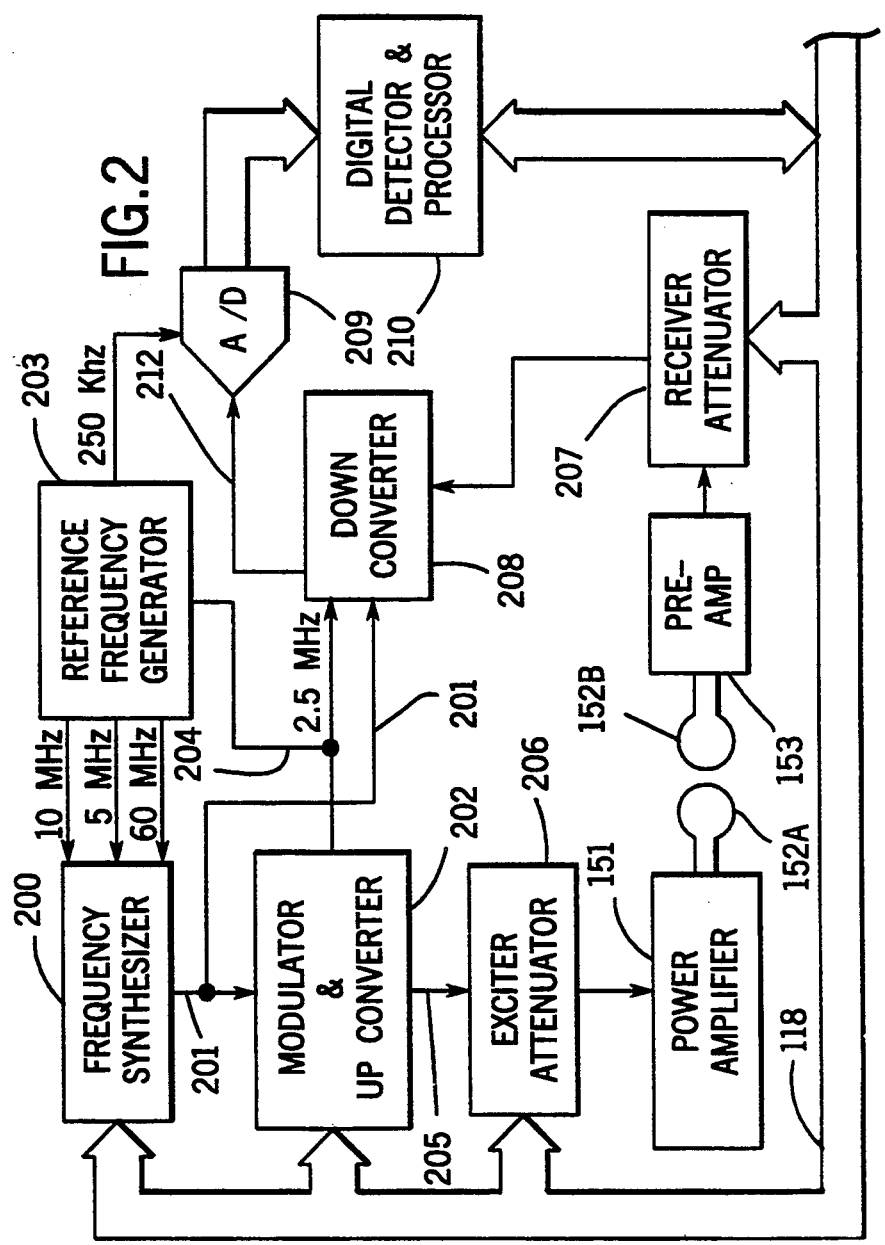
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

As is well known in the art, any number of different pulse sequences can be executed by the NMR system of FIG. 1 to acquire NMR data from which one or more images can be reconstructed. Some of these scans can take many minutes to run, while others can be completed in a few seconds. Regardless of the type of imaging pulse sequence used, the present invention is applicable when patient motion due to respiration is a concern and the patient is instructed to hold his breath for one or more short intervals during which the image data is acquired.

Referring particularly to FIG. 3, to practice the present invention the scan is broken into a series of cycles composed of two parts, a breathing detection part and a data acquisition part. During the breathing detection part the patient breathes as indicated by the oscillating diaphragm location curve 10, but at some point begins a breath-hold. A short time interval ($\tau$) thereafter, a respiratory trigger pulse 11 is produced and applied to the pulse generator module 121, which starts the data acquisition part by executing the desired imaging pulse sequence. The data acquisition part continues for a reasonable time period (e.g. up to 20 seconds) before it terminates and a new cycle begins. As many views as possible are acquired during the data acquisition part, or if fast pulse sequences are used, an entire image may be acquired. This cycle is repeated as many times as needed to complete the scan.

Referring particularly to FIG. 1, a respiration monitor is required to detect an acceptable breath-hold and to generate the respiratory trigger pulse 11. In the preferred embodiment the degree of chest inflation is monitored with NMR measurements of the superior-inferior (S/I) position of the patient's diaphragm. The NMR measurements are a series of navigator pulse sequences in which a column of spins located at the right side of the abdomen, and transecting the diaphragm near the dome of the liver is excited by a two-dimensional rf pulse. A subsequent NMR signal is acquired in the presence of a readout gradient ($G_z$ in the preferred embodiment) directed along the lengthwise dimension of the excited column and the 256 samples of the NMR navigator signal are Fourier transformed by the array processor 161 and conveyed to the position detector module 109. The two-dimensional excitation rf pulse is a 300 mm diameter Gaussian excitation of 12 msec. duration which produces a 90° flip angle. As described, for example, in U.S. Pat. No. 4,812,760, such two-dimensional rf pulses are produced in the presence of two gradient fields ($G_x$ and $G_y$ in the preferred embodiment). The receiver low pass filter is set for a 260 mm field of view along the excited column (z axis). The NMR signal is sampled at 256 points during a 4 msec. sample period and a pulse repetition rate of TR=70 msecs. is employed.

Referring particularly to FIG. 4, the diaphragm position in the excited column appears as an inflection in the acquired and Fourier transformed NMR navigator signal. The magnitude of the transformed NMR navigator signal is shown by graph 15 and the inflection 16 is a sharp change in magnitude. The position of this inflection is determined by the module 109 using an edge detection (derivative filter) technique which includes a 20-sample wide averaging filter to reduce higher frequency noise, followed by a 5-sample high pass filter which extracts the diaphragm edge. As shown in FIG. 4, the diaphragm edge is located at the point 17 along the z axis corresponding to the minimum 18 in this filtered NMR navigator signal 19. The 128 most recent transformed, but unfiltered navigator signals are produced as a brightness display to the operator and a graph of the most recent transformed and filtered navigator signal 15 is also produced on display 104. The former shows the breathing pattern for the preceding nine seconds, while the inflection in the latter shows the current diaphragm position. The display is updated every TR interval of the navigator pulse sequence.

During the breath-hold part of the first cycle the operator chooses from the Fourier transformed navigator signal the location of a 40 sample wide searching window which contains the diaphragmatic position. After the patient stabilizes chest inflation, this position is chosen as the "reference" point and the respiratory trigger signal 11 is applied to the pulse generator 121 to initiate acquisition of the image data. In subsequent breath-holds the patient's diaphragm position is determined by subtracting this reference position from the detected diaphragm position. This position is converted into an analog signal by module 109 and is directed to an assembly of 20 light-emitting-diodes (LED) in the display 114. The display 114 includes a dot/bar display model LM 3914 manufactured by National Semiconductor, Inc. which energizes one of the 20 LEDs. The analog signal is scaled so that each LED in display 114 corresponds to one pixel along the navigator signal readout direction. The number of LEDs in one direction or the other from the center LED in the display 114 is proportional to the distance between the patient's current diaphragm position and the desired reference position. As shown in FIG. 1, this display 114 is placed so that while positioned in the MRI scanner, the patient can clearly see it through a mirror 117.

During the second and any subsequent breathing cycles during the scan, the patient adjusts chest inflation until only the center LED in display 114 is lit. This is equivalent to matching the instantaneous diaphragmatic position to within 1 pixel of the pre-established reference position. Once this is attained and maintained for 10 TR intervals (time $\tau$ in FIG. 3), stabilization of chest inflation is assured and the trigger signal 11 is issued by module 109 to start acquisition of the image data. The word "HOLD" is also displayed with LEDs to the patient until the image acquisition portion of the cycle is done so that the patient will not attempt to adjust breath-hold position during the image acquisition.

While the use of NMR navigator signals is the preferred method for monitoring diaphragm position, it should be apparent to those skilled in the art that other techniques may be employed. For example, the signal from physiological acquisition controller 129 that indicates patient respiration based on respiratory bellows or other sensor devices may be used to detect diaphragm position. Also, other types of display devices may be used to visually feedback diaphragm position to the patient and the feedback device may produce an audio indication to the patient of diaphragm position and the "hold" command.

We claim:

1. In an NMR system for performing an image scan in which a series of NMR imaging pulse sequences are executed to acquire a corresponding series of NMR signals from which an image of a patient is reconstructed, the improvement comprising:

a respiration monitor for producing a respiration signal indicative of the position of the patient's diaphragm during patient respiration;

feedback means for receiving the respiration signal and providing the patient with an indication which enables the patient to initiate a breath-hold at a diaphragm reference position; and means for producing a respiration trigger signal after the patient initiates a breath-hold near the diaphragm reference position to enable the execution of NMR imaging pulse sequences during the breath-hold.

2. The improvement as recited in claim 1 in which the means for producing a respiration trigger signal receives the respiration signal, and when that received respiration signal indicates the diaphragm of the patient is at the diaphragm reference position for a preset time interval, the respiration trigger signal is produced.

3. The improvement as recited in claim 1 in which the feedback means includes a display and the patient is provided a visual indication of diaphragm position on the display.

4. The improvement as recited in claim 3 in which the display includes a series of lights which indicate diaphragm position by their illumination.

5. The improvement as recited in claim 1 in which the respiration monitor includes:

means for acquiring NMR navigator data from a region in the patient which includes the patient's diaphragm;

means for processing the acquired NMR navigator data to locate the position of the patient's diaphragm; and wherein the respiration signal is produced by repeatedly acquiring and processing NMR navigator data.

6. The improvement as recited in claim 5 in which the means for acquiring NMR navigator data produces a two-dimensional rf excitation field pulse which excites a column of spins in the patient that transects the patient's diaphragm.

7. The improvement as recited in claim 5 in which the means for processing the acquired NMR navigator data includes:

means for Fourier transforming the acquired NMR navigator data;

means for filtering the Fourier transformed NMR navigator data; and means for detecting an inflection in the filtered NMR navigator data which indicates the position of the patient's diaphragm.

8. A method for acquiring image data from a patient by performing a series of NMR image pulse sequences, the steps comprising:

a) monitoring the respiration of the patient;

b) displaying to the patient an indication that a breath-hold can be achieved at a reference position of the patient's diaphragm;

c) detecting that the patient has achieved a breath-hold near the reference position of the patient's diaphragm for a time interval;

d) performing NMR image pulse sequences during a data acquisition interval after the patient has achieved a breath-hold near the reference position;

e) displaying to the patient an indication that the breath-hold should be maintained during the data acquisition interval; and f) repeating steps a) through e) until all the image data is acquired.

9. The method as recited in claim 8 in which step a) is performed by:

a1) performing an NMR navigator pulse sequence in which NMR navigator data is acquired from a region in the patient that includes the patient's diaphragm; and a2) processing the NMR navigator data to produce an indication of the position of the patient's diaphragm.

* * * * *

UNITED STATES PATENT AND TRADEMARK OFFICE
CERTIFICATE OF CORRECTION

PATENT NO.   : 5,363,844
DATED        : November 15, 1994
INVENTOR(S)  : Riederer, et al.

It is certified that error appears in the above-identified patent and that said Letters Patent is hereby corrected as shown below:

Column 1,
Line 2, above "BACKGROUND OF THE INVENTIION", please insert the following: Under a separate heading of "Government License Rights"

"The U.S. Government has paid-up license in this invention and the right in limited circumstances to require the patent owner to license others on reasonalbe terms as provided for by the terms of CA37993 and HL 37310 awared by the National Institutes of Health."

Signed and Sealed this

Thirty-first Day of July, 2001

Attest:

*Nicholas P. Godici*

Attesting Officer

NICHOLAS P. GODICI
*Acting Director of the United States Patent and Trademark Office*